(12) United States Patent
Kim et al.

(10) Patent No.: US 11,337,005 B2
(45) Date of Patent: May 17, 2022

(54) MEMS CAPACITIVE MICROPHONE

(71) Applicant: Kyeong Won Kim, Daejeon (KR)

(72) Inventors: Kyeong Won Kim, Daejeon (KR); Tae Joon Lee, Goyang-si (KR)

( * ) Notice: Subject to any disclaimer, the term of this patent is extended or adjusted under 35 U.S.C. 154(b) by 0 days.

(21) Appl. No.: 17/268,466

(22) PCT Filed: Aug. 5, 2019

(86) PCT No.: PCT/KR2019/009751
§ 371 (c)(1),
(2) Date: Feb. 14, 2021

(87) PCT Pub. No.: WO2020/045843
PCT Pub. Date: Mar. 5, 2020

(65) Prior Publication Data
US 2021/0185448 A1  Jun. 17, 2021

(30) Foreign Application Priority Data
Aug. 31, 2018  (KR) .................. 10-2018-0103509

(51) Int. Cl.
*H04R 7/00* (2006.01)
*H04R 7/24* (2006.01)
*B81B 3/00* (2006.01)
*H04R 7/04* (2006.01)
(Continued)

(52) U.S. Cl.
CPC ............. *H04R 7/24* (2013.01); *B81B 3/007* (2013.01); *B81B 3/0021* (2013.01); *H04R 7/04* (2013.01); *H04R 7/18* (2013.01); *H04R 19/04* (2013.01); *B81B 2201/0257* (2013.01); *B81B 2203/0127* (2013.01); *B81B 2203/0136* (2013.01); *B81B 2203/0307* (2013.01); *B81B 2203/04* (2013.01); *H04R 2201/003* (2013.01); *H04R 2410/03* (2013.01)

(58) Field of Classification Search
CPC ... H04R 7/24; H04R 7/04; H04R 7/18; H04R 19/04; H04R 2201/003; H04R 2410/03; H04R 19/005; H04R 31/00; B81B 3/0021; B81B 3/007; B81B 2201/0257; B81B 2203/0127; B81B 2203/0136; B81B 2203/0307; B81B 2203/04
See application file for complete search history.

(56) References Cited

U.S. PATENT DOCUMENTS

| | | | |
|---|---|---|---|
| 9,131,319 B2* | 9/2015 | Zoellin | H04R 19/04 |
| 10,315,912 B2* | 6/2019 | Nawaz | B81B 7/0032 |
| 10,425,743 B2* | 9/2019 | Kasai | H04R 19/005 |

(Continued)

*Primary Examiner* — Matthew A Eason
(74) *Attorney, Agent, or Firm* — Revolution IP, PLLC

(57) ABSTRACT

A MEMS capacitive microphone according to the present invention is configured such that a support plate 120 from which an inside thereof has been removed in a plane is attached to supports 110 each having an end fixed to a substrate 100, an anchor 130 is attached to an edge region of the support plate 120, an edge of a diaphragm 200 is supported by the anchor 130, and a "substrate-free area" includes the anchor 130 in a plan view, and pluralities of moving comb fingers 300 and stiffeners are attached to a top or bottom or a top and bottom of the diaphragm 200, and the supports 110 support the stationary comb fingers 400 arranged at predetermined intervals on both sides of the moving comb fingers 300 in a plan view.

17 Claims, 10 Drawing Sheets

(51) Int. Cl.
*H04R 7/18* (2006.01)
*H04R 19/04* (2006.01)

(56) References Cited

U.S. PATENT DOCUMENTS

| | | | | |
|---|---|---|---|---|
| 2014/0105428 A1* | 4/2014 | Zoellin | ............... | H04R 23/00 |
| | | | | 381/174 |
| 2014/0109680 A1* | 4/2014 | Tsai | ............... | G01L 9/0072 |
| | | | | 73/702 |
| 2014/0233767 A1* | 8/2014 | Chen | ............... | H04R 7/14 |
| | | | | 381/174 |
| 2015/0110309 A1* | 4/2015 | Park | ............... | H04R 17/00 |
| | | | | 381/190 |
| 2019/0058936 A1* | 2/2019 | Dehe | ............... | H04R 7/14 |

* cited by examiner

MEMS CAPACITIVE MICROPHONE

CROSS-REFERENCE TO RELATED APPLICATIONS

This application is a national stage application of International Patent Application No. PCT/KR2019/009751 filed on Aug. 5, 2019, which claims priority to Korean Patent Application No. 10-2018-0103509 filed on Aug. 31, 2018, the entire contents of which are incorporated by reference herein.

TECHNICAL FIELD

The present invention relates to a MEMS capacitive microphone that detects a change in capacitance attributable to sound waves.

BACKGROUND

In general, a MEMS capacitive microphone operates based on the principle of measuring a capacitance between a diaphragm configured to be displaced in proportion to the strength of sound waves and a backplate disposed opposite the diaphragm.

As an example of the above technology, MEMS capacitive microphones are disclosed in U.S. patent Ser. No. 07/146,016, U.S. patent Ser. No. 08/921,956, U.S. patent Ser. No. 08/422,702, U.S. Patent No. 2012-0294464, and U.S. Patent No. 2013-0108084.

Generally, MEMS microphones entail the process of etching the underside of a substrate having a thickness of several hundred μm in order to float a diaphragm and a backplate in the air. In this thick etching process, there is inevitably a large error between a first pattern size and a finally etched area.

Accordingly, in the structure shown in FIG. 1A in which a MEMS capacitive microphone disclosed in Korean Patent Application Publication No. 10-2016-0050886 is shown in a cross-section view, the area of a diaphragm becomes inaccurate due to an incorrectly formed "substrate-free area," and thus non-uniformity occurs in the wafer-to-wafer or run-to-run area of the diaphragm (a backplate structure is omitted in FIG. 1A.

The mechanical properties of a diaphragm, such as the stiffness of the diaphragm that determines the sensitivity of a microphone, and the natural frequency of the diaphragm that determines the frequency bandwidth of the microphone are considerably sensitive to the area of the diaphragm. Accordingly, when the area of the diaphragm is non-uniform, the characteristics of the microphone become non-uniform.

Furthermore, the area of the diaphragm is inevitably designed to have a margin by taking into consideration the non-uniform "substrate-free area." If the "substrate-free area" is formed to be smaller than a target, the relatively large area of the diaphragm is placed on the substrate, and thus the diaphragm placed in a large area on the substrate generates a large parasitic capacitance between the diaphragm and the substrate.

Since the output signal of the microphone is attenuated by the parasitic capacitance, the sensitivity of the microphone is degraded and non-uniform due to the nun-uniform "substrate-free area."

Meanwhile, there may be proposed various methods of making the area of a diaphragm uniform even when the area of a "substrate-free area" is non-uniform.

For example, there may be presented a cross-sectional structure disclosed in Korean Patent Application Publication No. 10-2017-0121956 and the document "MEMS Capacitive Microphone with Dual-Anchored Membrane, Eurosensors 2017 Conference, Paris, France, 3-6 Sep. 2017" and shown in FIG. 1B (a backplate structure is omitted in FIG. 1B.

In this structure, the area of a diaphragm is already determined, and the diaphragm is supported by an anchor located on a substrate. Accordingly, if a "substrate-free area" is formed inside a position where the anchor is formed in a plan view, the area of the diaphragm can be made uniform regardless of the area of the "substrate-free area."

However, in this case, a disadvantage arises in that a high acoustic resistance occurs in the gap present between the diaphragm and the substrate, resulting in poor signal-to-noise ratio (SNR).

SUMMARY

An object of the present invention is to provide a MEMS capacitive microphone in which the area of a diaphragm is uniform, the parasitic capacitance of the diaphragm is low, and acoustic resistance is minimized, thereby having uniform sensitivity and excellent signal-to-noise ratio.

In order to accomplish the above object, the present invention provides a MEMS capacitive microphone, wherein: a support plate 120 from which an inside thereof has been removed in a plane is attached to supports 110 each having an end fixed to a substrate 100, an anchor 130 is attached to an edge region of the support plate 120, an edge of a diaphragm 200 is supported by the anchor 130, and a "substrate-free area" includes the anchor 130 in a plan view; pluralities of moving comb fingers 300 and stiffeners are attached to a top or bottom or a top and bottom of the diaphragm 200, and the supports 110 support the stationary comb fingers 400 arranged at predetermined intervals on both sides of the moving comb fingers 300 in a plan view; when the moving comb fingers 300 and the stiffeners are attached to the top of the diaphragm 200, the supports 110 and the stationary comb fingers 400 are located above the diaphragm 200, the support plate 120 is attached to a bottom of the support 110, and the stationary comb fingers 400 are deviated upward from the moving comb fingers 300; when the moving comb fingers 300 and the stiffeners are attached to the bottom of the diaphragm 200, the supports 110 and the stationary comb fingers 400 are located below the diaphragm 200, the support plate 120 is attached to a top of the support 110, and the stationary comb fingers 400 are deviated downward from the moving comb fingers 300; and, when the moving comb fingers 300 and the stiffeners are attached to the top and bottom of the diaphragm 200, the supports 110 and the stationary comb fingers 400 are located above and below the diaphragm 200, the support plate 120 is attached to a bottom of a lower support 110a and a top of a lower support 110b, and upper stationary comb fingers 400a are deviated upward from upper moving comb fingers 300a and lower stationary comb fingers 400b are deviated downward from lower moving comb fingers 300b.

According to another embodiment of the present invention, there is provided a MEMS capacitive microphone, wherein: a support plate 120 from which an inside thereof has been removed in a plane is attached to supports 110 each having an end fixed to a substrate 100, an anchor 130 is attached to an edge region of the support plate 120, an edge of a diaphragm 200 is supported by the anchor 130, and a "substrate-free area" includes the anchor 130 in a plan view;

a plurality of stiffeners and a plurality of moving comb fingers 300 which are formed in an area from which the diaphragm 200 has been removed and ends of which have been fixed to the diaphragm 200 are attached to a top or bottom or a top and bottom of the diaphragm 200, and the supports 110 support the stationary comb fingers 400 arranged at predetermined intervals between the moving comb fingers 300 in a plan view; when the moving comb fingers 300 and the stiffeners are attached to the top of the diaphragm 200, the supports 110 and the stationary comb fingers 400 are located above the diaphragm 200, the support plate 120 is attached to a bottom of the support 110, and the stationary comb fingers 400 are deviated upward from the moving comb fingers 300; when the moving comb fingers 300 and the stiffeners are attached to the bottom of the diaphragm 200, the supports 110 and the stationary comb fingers 400 are located below the diaphragm 200, the support plate 120 is attached to a top of the support 110, and the stationary comb fingers 400 are deviated downward from the moving comb fingers 300; and, when the moving comb fingers 300 and the stiffeners are attached to the top and bottom of the diaphragm 200, the supports 110 and the stationary comb fingers 400 are located above and below the diaphragm 200, the support plate 120 is attached to a bottom of a lower support 110a and a top of a lower support 110b, and upper stationary comb fingers 400a are deviated upward from upper moving comb fingers 300a and lower stationary comb fingers 400b are deviated downward from lower moving comb fingers 300b.

The diaphragm 200 may be one selected from an edge clamped diaphragm and an edge released diaphragm.

When the diaphragm 200 is the edge released diaphragm, the support plate 120 may be extended within 20 μm from a gap between the spring 210 and the diaphragm 200 into the diaphragm 200 in a plan view.

The diaphragm 200 may have a circular, square, rectangular, hexagonal or octagonal shape, or a polygonal shape having arbitrary surfaces, and may have an area of 0.01 to 4 mm².

The support 110, the stiffeners, the moving comb fingers 300, and the stationary comb fingers 400 may have a thickness of 2 to 20 μm, and the support 110, the stiffeners, the moving comb fingers 300, and the stationary comb fingers 400 may have a width of 1 to 10 μm.

The interval between the moving comb fingers 300 and the stationary comb fingers 400 may be 0.5 to 5 μm, and the distance to which the stationary comb fingers 400 are deviated vertically from the moving comb fingers 300 may be 1 to 10 μm.

The thickness of the support plate 120 may be 0.1 to 2 μm.

The interval between the stationary comb fingers 400 and the stationary comb fingers 400 may be 5 to 20 μm.

The cross-sectional structure of the anchor 130 may be one selected from: a structure in which the anchor 130 is formed between the diaphragm 200 and the support plate 120; a structure in which the anchor 130 is formed between the diaphragm 200 and the support plate 120 and the anchor 130 in a membrane form additionally supports a bottom of the diaphragm 200 or the support plate 120; a structure in which the anchor 130 is formed between the diaphragm 200 and the support plate 120 and the anchor 130 supports the diaphragm 200 or the support plate 120 in a '⊔' form; a structure in which the anchor 130 is formed through the diaphragm 200 or the support plate 120; a structure in which the anchor 130 is formed through the diaphragm 200 or the support plate 120 and the diaphragm 200 or the support plate 120 is additionally covered by the anchor 130 in a membrane form; and a structure in which the anchor 130 is formed through the diaphragm 200 or the support plate 120 in a '⊔' form.

The planar structure of the anchor 130 may be one selected from: a closed curve structure in which the anchor 130 surrounds the diaphragm 200 at the diaphragm edge 200a in one line; a closed curve structure in which the anchor 130 includes anchors that surround the diaphragm 200 at the diaphragm edge 200a in two or more lines; a structure in which the anchor 130 includes anchors that are arranged along the diaphragm edge 200a in a point or line form having a predetermined width and diameter; and a structure in which the anchor 130 includes anchors one or more lines of which are connected by a closed curve to form a circle, square or rod form and arranged along the diaphragm edge 200a.

The anchor 130 may have a width in a range of 0.2 to 20 μm and a thickness in a range of 1 to 10 μm.

The diaphragm 200, the stiffeners, the moving comb fingers 300 and the stationary comb fingers 400 may be made of one selected from polysilicon, amorphous silicon, aluminum, titanium, magnesium, nickel, tungsten, and copper.

The supports 110, the support plate 120 and the anchor 130 may be made of one or more selected from polysilicon, amorphous silicon, aluminum, titanium, magnesium, nickel, tungsten, copper, silicon nitride, silicon carbide, aluminum oxide, and aluminum nitride.

The stiffeners or supports 110 may be coupled in groups including one or more members; and the coupled stiffeners or supports 110 may be connected in parallel with each other; the coupled stiffeners or supports 110 may be connected in a polygonal form; or the stiffeners or supports 110 connected in parallel with each other and the stiffeners or supports 110 connected in a polygonal form may be connected in a coupled form.

In a MEMS capacitive microphone in which the moving comb fingers 300 and the stiffeners are attached to a bottom of the diaphragm 200, the supports 110 and the stationary comb fingers 400 are located below the diaphragm 200, and the stationary comb fingers 400 are deviated downward from the moving comb fingers 300, and a MEMS capacitive microphone in which the moving comb fingers 300 and the stiffeners are attached to a top and bottom of the diaphragm 200, the supports 110 and the stationary comb fingers 400 are located above and below the diaphragm 200, and the stationary comb fingers 400 are deviated upward and downward from the moving comb fingers 300; 50% or more of the thickness of the lower moving comb fingers 300b, the lower stationary comb fingers 400b, and the lower supports 110b may be located below the silicon surface of the silicon substrate.

The supports 110 may each have a structure extending upward or downward based on the deviated direction so that it has a '⊓'- or '⊔'-shaped cross-section.

The MEMS capacitive microphone of the present invention provides a microphone having uniform sensitivity and excellent signal-to-noise ratio.

DETAILED DESCRIPTION OF THE DISCLOSURE

Figure 1A:
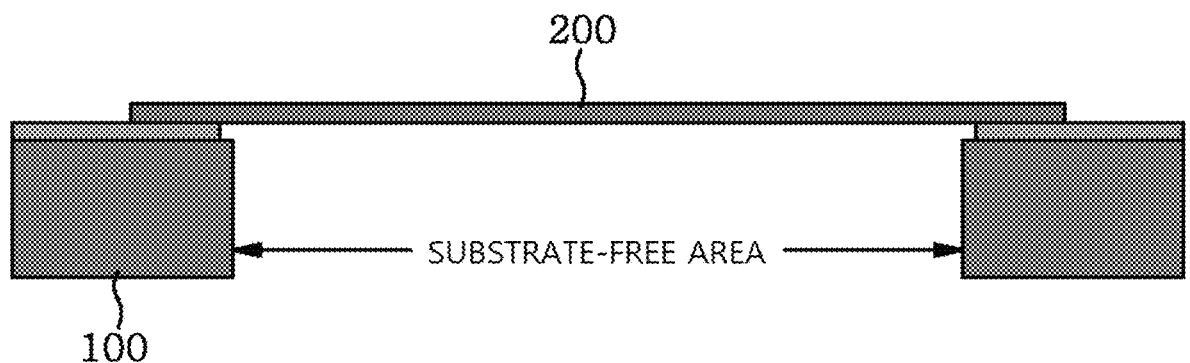
FIGS. 1A and 1B are cross-sectional views illustrating the relationship between the area of a "substrate-free area" and the area of a diaphragm in the structure of a conventional MEMS microphone.

Terms and words used in the specification and the claims should not be interpreted as being limited to commonly used meanings or meanings in dictionaries and should be interpreted as having meanings and concepts that are consistent with the technological spirit of the invention based on the principle that an inventor may appropriately define the concepts of terms in order to describe his or her invention in the best way.

Accordingly, the embodiments described in the present specification and the items shown in the drawings are only the most preferred embodiments of the present invention and do not represent the overall technical spirit of the present invention, so that it should be understood that there may be various equivalents and alterations that can be substituted for the embodiments and the items at the time when the present application is filed.

Prior to the following description given with reference to the drawings, it is noted that items that are not necessary to reveal the gist of the present invention, i.e., known components that can be obviously added by those skilled in the art, are neither shown nor specifically described.

Figure 2:
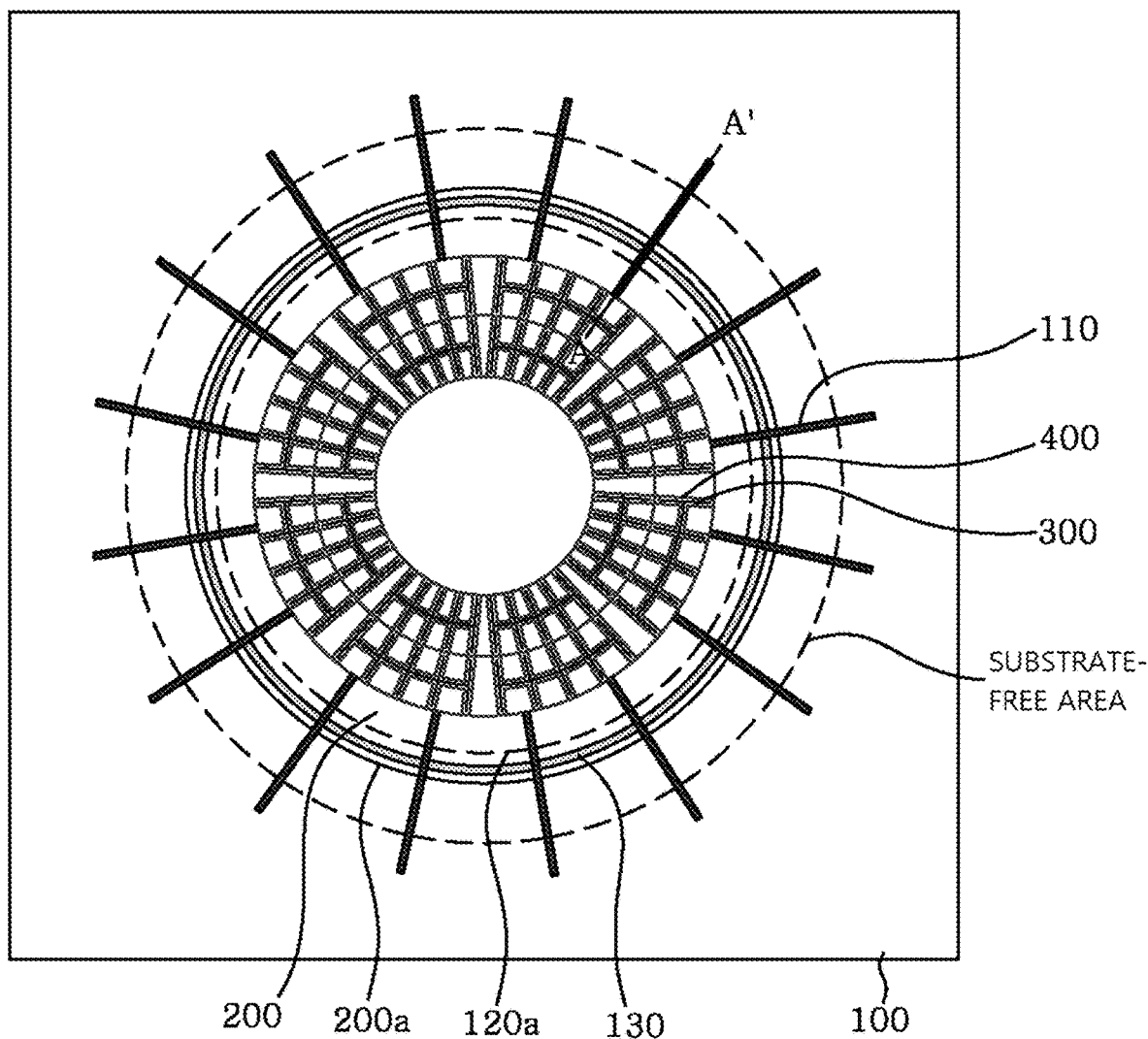
FIG. 2 is a view showing the planar structure of a MEMS capacitive microphone to which a support plate and an anchor provided in the present invention are applied and in which stationary comb fingers are disposed at predetermined intervals on both sides of moving comb fingers in a plan view.

FIG. 2 shows a plan view of a MEMS capacitive microphone in which stationary comb fingers are disposed on both sides of moving comb fingers in order to describe the effects of a support plate and an anchor provided in the present invention.

First, the operation principle and structure of the shown microphone will be described, and then the effects of a support plate and anchor provided by the present invention will be described.

A plurality of comb fingers (referred to as moving comb fingers) having a predetermined thickness and width are attached to a diaphragm 200 from which a substrate 100 located below the diaphragm 200 has been removed.

Meanwhile, supports 110 the ends of which are fixed to the substrate 100 support comb fingers (referred to as stationary comb fingers) that are disposed on both sides of the moving comb fingers 300 to be spaced apart by a predetermined interval in a plan view and have a predetermined thickness and width.

In this case, the stationary comb fingers 400 are deviated from and overlap with the moving comb fingers 300 in the vertical direction, and thus a capacitance is present between the moving comb fingers 300 and the stationary comb fingers 400.

When sound waves are applied, the diaphragm 200 is displaced in the vertical direction by sound pressure, and thus the moving comb fingers 300 attached to the diaphragm 200 are also displaced in the vertical direction.

In contrast, the stationary comb fingers 400 are attached to the supports 110 having high rigidity, and thus the displacement caused by sound waves rarely occurs. Accordingly, when sound waves are applied, the capacitance between the moving comb fingers 300 and the stationary comb fingers 400 changes. When the change in capacitance is measured between the diaphragm 200 made of a conductor and the support 110 and then signal processing is performed, the sound waves may be reproduced.

In the MEMS capacitive microphone of FIG. 2 that operates according to the above principle, the moving comb fingers 300 and the stationary comb fingers 400 have a small width, a large thickness, and a large length, and it is preferable that the narrower the interval between the moving comb fingers 300 and the stationary comb fingers 400 is, the higher the capacitance is.

Furthermore, it is preferable in terms of the detection of a change in capacitance that the degree of deviation of the stationary comb fingers 400 is sufficient.

Furthermore, as the interval between the stationary comb fingers 400 and the stationary comb fingers 400 becomes wider, the resistance of air decreases when the diaphragm 200 is displaced by sound waves, and thus it is preferable to maintain a sufficient interval.

For example, the width of the moving comb fingers 300 and the stationary comb fingers 400 may be designed to be 1 to 10 µm, the thickness thereof may be designed to be 2 to 20 µm, the length thereof may be designed to be 10 to 100 µm, the interval between the moving comb fingers 300 and the stationary comb fingers 400 may be designed to be 0.5 to 5 µm, and the interval between the stationary comb fingers 400 may be designed to be 5 to 20 µm. Furthermore, the vertical displacement of the stationary comb fingers 400 from the moving comb fingers 300 or the vertical distance of the supports 110 and the stationary comb fingers 400 from the diaphragm 200 may be designed to be 1 to 10 µm that is smaller than the thickness of the moving comb fingers 300 and the stationary comb fingers 400. Moreover, the interval between the supports 110 may be designed to be 5 to 20 µm.

Meanwhile, although not shown in FIG. 2, stiffeners (not shown) formed through the same process and in the same structure as moving comb fingers 300 in order to reinforce the stiffness of the diaphragm 200 as necessary may be additionally attached to the diaphragm 200. Since the supports 110 and the stiffeners are required to have higher rigidity than the diaphragm 200, the thickness thereof needs to be larger than that of the diaphragm 200 (the structural rigidity of a beam is proportional to the third power of the thickness).

For example, it is proposed that the thickness of the diaphragm 200 is 0.3 to 3 µm while the thickness of the supports 110 and the stiffeners is 2 to 20 µm. The width of the supports 110 and the stiffeners is typically designed to be in the same range of 1 to 10 µm as the moving comb fingers 300 and the stationary comb fingers 400.

Each of the supports 110 and the stiffeners may be formed by connecting a plurality of supports or stiffeners in order to further increase the rigidity. Furthermore, it may also be possible to increase the rigidity by connecting one or more supports 110 to each other in various polygonal shapes such as triangular, square and hexagonal shapes and the like.

For example, various forms are configured by combining the support 110 configured in a polygonal shape with the support 110 having a parallel shape. Another example is a mesh form based on the above polygonal shape.

Furthermore, depending on design conditions, each supporter 110 may be configured to have a '⊓' or '⊔'-shaped cross-section at a point where the supporter 110 crosses the stiffener by additionally forming an conductor through separate sacrificial layer filling on the upper or lower side of the supporter 110 based on a deviated direction.

An example of the above case is a MEMS capacitive microphone that is described in Korean Patent Application No. 10-2018-0052223 filed by the present applicant.

Since the capacitance between the moving comb fingers 300 and the stationary comb fingers 400 needs to be measured through the diaphragm 200 and the supports 110, the moving comb fingers 300, the stationary comb fingers 400, the diaphragm 200, and the supports 110 need to be made of a conductive material. However, the remaining supports 110 excluding a minimum number of supports may be made of a non-conductor.

For example, polysilicon, amorphous silicon, aluminum, magnesium, nickel, titanium, vanadium, zirconium, chromium, tungsten, molybdenum, and tantalum may be used as the material of the moving comb fingers 300, the stationary comb fingers 400, the diaphragm 200, and the supports 110. In the case where the supports are made of a non-conductor, silicon nitride, silicon carbide, aluminum oxide, and aluminum nitride may be used.

The area of the diaphragm 200 may be designed to fall within a range of 0.1×0.1 mm (0.01 mm$^2$) to 2×2 mm (4 mm$^2$), and it is obvious that the shape of the diaphragm 200 may be a square, a rectangle, a hexagon, an octagon, or any polygon other than the circle.

As described above, the operation principle and structure of the microphone shown in FIG. 2 have been described.

The structure and effect of the support plate and the anchor provided by the present invention continues to be described below with reference to FIG. 2.

In FIG. 2, an anchor 130 surrounding the diaphragm 200 is formed inside a diaphragm edge 200a. The diaphragm 200 is supported on the anchor 130. The anchor 130 is attached near the edge of the support plate 120 attached to the support 110 with the inside of the support plate 120 removed in a plan view. Accordingly, the diaphragm 200 is finally supported by the support 110 through the anchor 130 and the support plate 120.

The rigidity of the supports 110 is considerably high. Accordingly, even when the diaphragm 200 is supported on the supports 110, a problem does not occur with the mechanical properties of the supports 110 and the diaphragm 200. The support plate 120 serves to prevent sound waves from escaping through the supports 110 by sealing the gaps between the supports 110 having a rod shape and a mesh shape.

The anchor 130 is formed by being aligned with the edge of the support plate 120a and the area of the diaphragm 200 is determined in advance by being aligned with the anchor 130, and thus the mechanical properties of the diaphragm 200 of the microphone shown in FIG. 2 become uniform regardless of the area of the "substrate-free area."

Furthermore, the diaphragm edge 200a is formed to be considerably close to the support plate edge 120a through the anchor 130 in a plan view, and thus the overlapping area between the diaphragm 200 and the support plate 120 is considerably small. Accordingly, when the "substrate-free area" includes a location where the anchor 130 is formed, the overlapping area between the diaphragm 200 and the substrate 100 does not occur.

Therefore, the parasitic capacitance of the diaphragm 200 is considerably small and uniformly present only between the diaphragm edge 200a and the support plate edge (or the support when the support plate is a non-conductor).

Figure 1B:
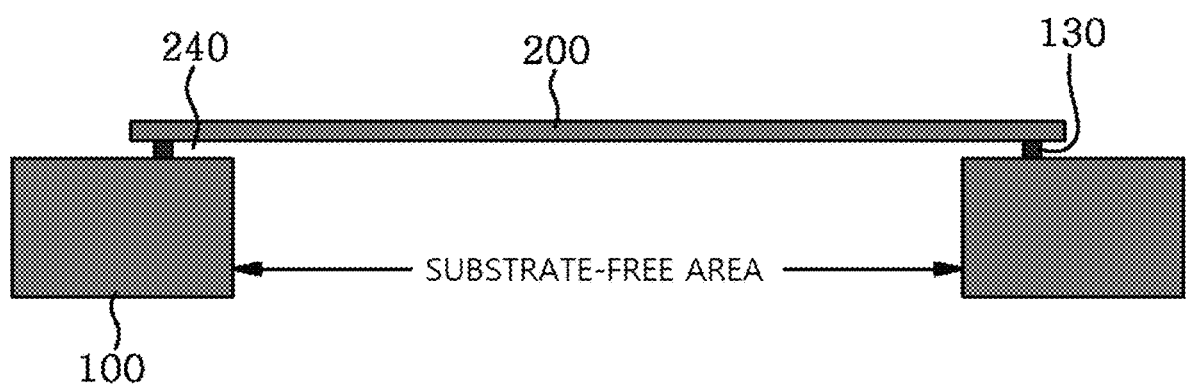

Furthermore, the overlapping area between the diaphragm 200 and the support plate 120 is considerably small and no overlapping area between the diaphragm 200 and the substrate 100 occurs, and thus there is no gap between the diaphragm 200 and the substrate 100 or between the diaphragm 200 and the support plate 120. Accordingly, acoustic resistance attributable to the gap shown in FIG. 1B rarely occurs.

As a result, the support plate 120 and the anchor 130 provided by the present invention minimize parasitic capacitance while maintaining the uniform area of the diaphragm 200 even when the area of the "substrate-free area" is not uniform, and eliminate acoustic resistance. In other words, a MEMS capacitive microphone having uniform sensitivity and excellent signal-to-noise ratio is provided.

Depending on design, the moving comb fingers 300 may be attached to the bottom of the diaphragm 200, or may be attached to the top of the diaphragm 200.

Meanwhile, the moving comb fingers 300 may be formed in pairs on the top and bottom of the diaphragm 200, and then the stationary comb fingers 400 may be formed in pairs in both vertical directions of the moving comb fingers 300. Accordingly, the vertical locations of the supports 110, the support plate 120, and the anchor 130 may also be present above and below the diaphragm 200 (on the upper and lower sides of the diaphragm 200).

Figure 3A:
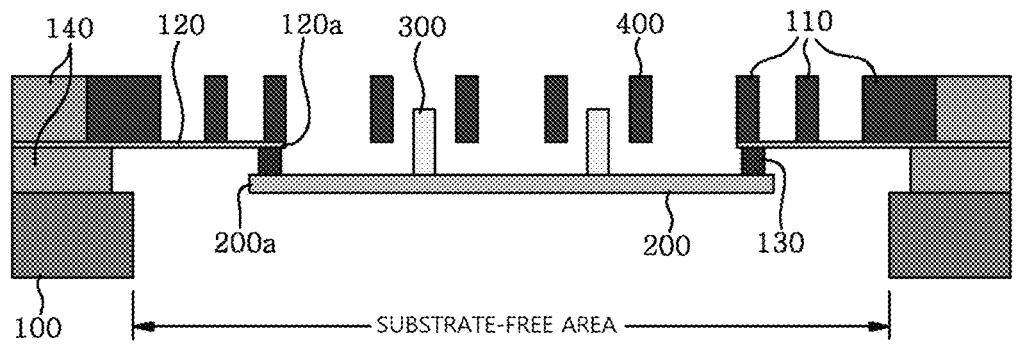
FIGS. 3A to 3C are views showing various cross-sectional structures of FIGS. 1A and 1B.
Figure 3B:
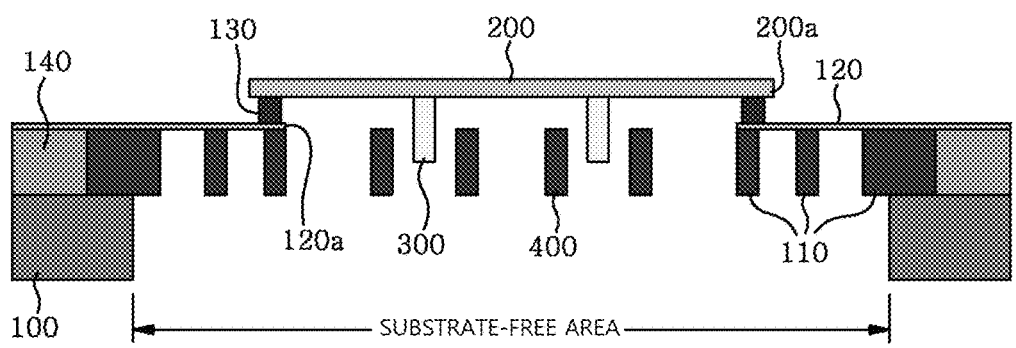
Figure 3C:
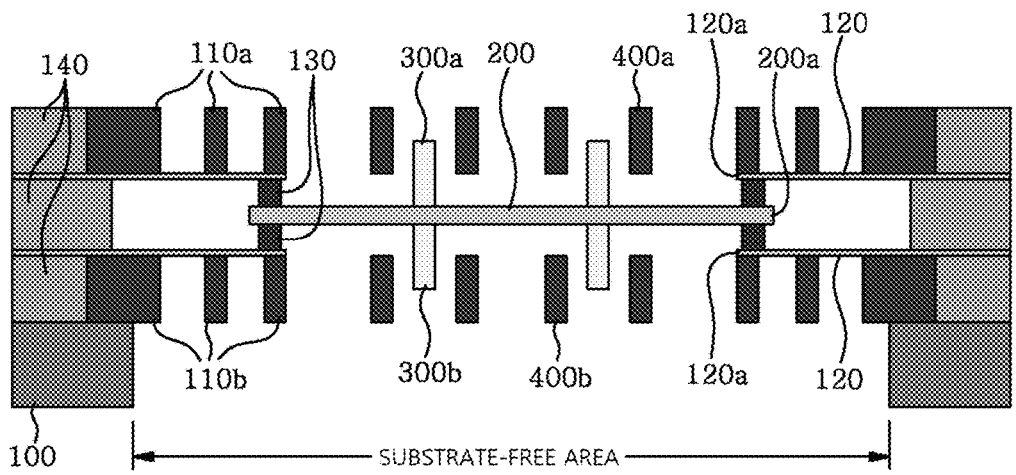

The structures of section A-A' of FIG. 2 for the above-described various cases are shown in FIGS. 3A to 3C.

FIG. 3A shows a structure in which moving comb fingers 300 are formed on the top of a diaphragm 200, and thus stationary comb fingers 400 and supports 110 are deviated upward from the moving comb fingers 300.

A support plate 120 is attached the bottoms of the supports 110, an anchor 130 is attached near the edge 120a of the support plate 120, and the diaphragm 200 is attached to and supported on the bottom of the anchor 130.

When a "substrate-free area" includes a place where the anchor 130 is located in a plan view, the area of the diaphragm 200 becomes uniform regardless of the area of the "substrate-free area," a low parasitic capacitance is present at the edge 200a of the diaphragm, and a gap acting as acoustic resistance is not present between the diaphragm 200 and the substrate 100 or between the diaphragm 200 and the support plate 120. As a result, a microphone having uniform sensitivity and excellent signal-to-noise ratio is implemented.

FIG. 3B shows a structure in which moving comb fingers 300 are formed on the bottom of a diaphragm 200 and stationary comb fingers 400 and supports 110 are deviated downward from the moving comb fingers 300.

A support plate 120 is attached the tops of the supports 110, an anchor 130 is attached near the edge 120a of the support plate 120, and the diaphragm 200 is attached to and supported on the top of the anchor 130.

When a "substrate-free area" includes a place where the anchor 130 is located in a plan view, the area of the diaphragm 200 becomes uniform regardless of the area of the "substrate-free area," a low parasitic capacitance is present at the edge 200a of the diaphragm, and a gap acting as acoustic resistance is not present between the diaphragm 200 and the substrate 100 or between the diaphragm 200 and the support plate 120. As a result, a microphone having uniform sensitivity and excellent signal-to-noise ratio is implemented.

FIG. 3C shows a structure in which moving comb fingers 300 are formed on the top and bottom of a diaphragm 200 and stationary comb fingers 400 and supports 110 are deviated upward or downward from the moving comb fingers 300.

A support plate 120 is attached to the bottom of the upper support 110 and the top of the lower support 110, and anchors 130 are attached near the edge 120a of the support plate 120. The diaphragm 200 is attached to and supported on the upper and lower anchors 130.

When a "substrate-free area" includes a place where the anchors 130 are located in a plan view, the area of the diaphragm 200 becomes uniform regardless of the area of the "substrate-free area," a low parasitic capacitance is present at the edge 200a of the diaphragm, and a gap acting as acoustic resistance is not present between the diaphragm 200 and the substrate 100 or between the diaphragm 200 and the support plate 120. As a result, a microphone having uniform sensitivity and excellent signal-to-noise ratio is implemented.

Meanwhile, in addition to the MEMS capacitive microphones in which the stationary comb fingers 400 are disposed on both sides of the moving comb fingers 300 in a plan view, which are shown in FIGS. 2 to 3C, there may be proposed a MEMS capacitive microphone in which moving comb fingers 300 are formed in an area where a diaphragm 200 is removed, ends of the moving comb fingers 300 are attached to the diaphragm 200, and stationary comb fingers 400 are disposed at predetermined intervals between the moving comb fingers 300 in a plan view.

Figure 4A:
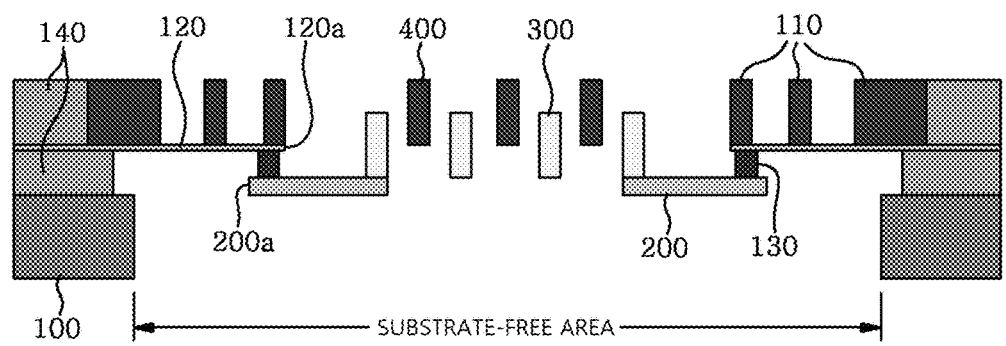
FIGS. 4A to 4C are views showing various cross-sectional structures of MEMS capacitive microphones to which the support plate and anchor of the present invention are applied and in which stationary comb fingers are disposed at predetermined intervals on both sides of moving comb fingers formed in a diaphragm-free area in a plan view.
Figure 4B:
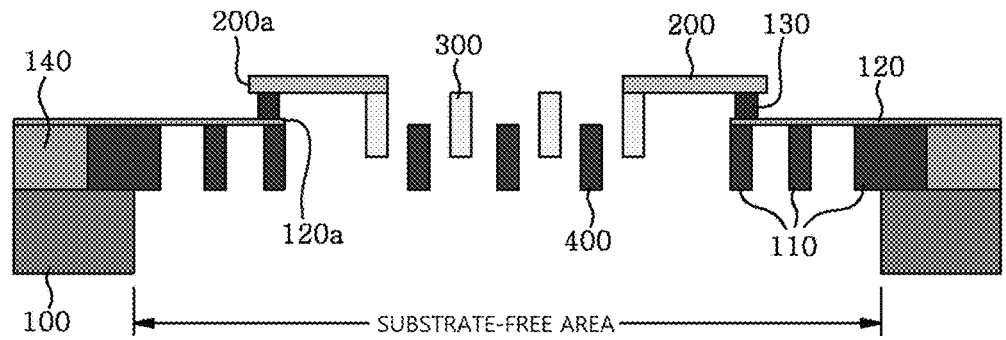
Figure 4C:
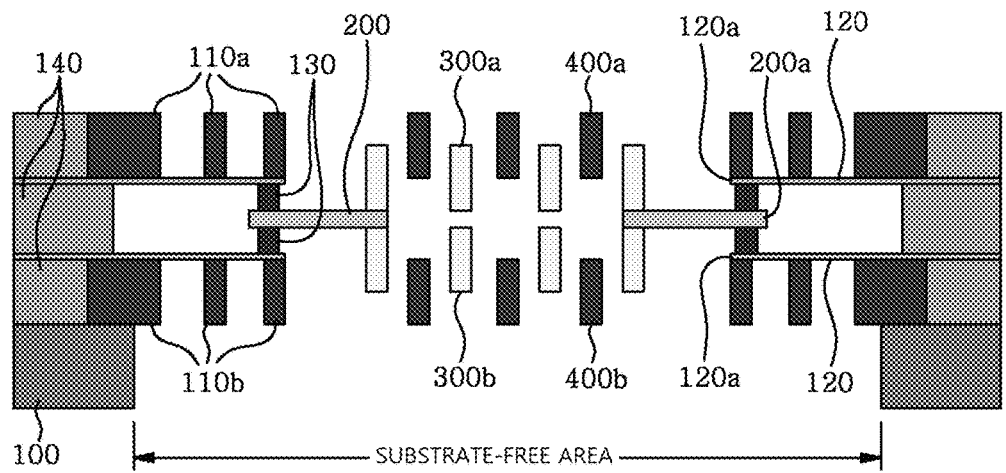

FIGS. 4A to 4C shows various cross-sections of MEMS capacitive microphones to which a support plate and an anchor provided by the present invention are applied and in which stationary comb fingers are disposed at predetermined intervals between moving comb fingers.

FIG. 4A shows a structure in which moving comb fingers 300 are formed on the top of a diaphragm 200 and stationary comb fingers 400 and supports 110 are deviated upward from the moving comb fingers 300.

A support plate 120 is attached the bottoms of the supports 110, an anchor 130 is attached near the edge 120a of the support plate 120, and the diaphragm 200 is attached to and supported on the bottom of the anchor 130.

When a "substrate-free area" includes a place where the anchor 130 is located in a plan view, the area of the diaphragm 200 becomes uniform regardless of the area of the "substrate-free area," a low parasitic capacitance is present at the edge 200a of the diaphragm, and a gap acting as an acoustic resistance is not present between the diaphragm 200 and the substrate 100 or between the diaphragm 200 and the support plate 120. As a result, a microphone having uniform sensitivity and excellent signal-to-noise ratio is implemented.

FIG. 4B shows a structure in which moving comb fingers 300 are formed on the bottom of a diaphragm 200 and stationary comb fingers 400 and supports 110 are deviated downward from the moving comb fingers 300.

A support plate 120 is attached the tops of the supports 110, an anchor 130 is attached near the edge 120a of the support plate 120, and the diaphragm 200 is attached to and supported on the top of the anchor 130.

When a "substrate-free area" includes a place where the anchor 130 is located in a plan view, the area of the diaphragm 200 becomes uniform regardless of the area of the "substrate-free area," a low parasitic capacitance is present at the edge 200a of the diaphragm, and a gap acting as acoustic resistance is not present between the diaphragm 200 and the substrate 100 or between the diaphragm 200 and the support plate 120. As a result, a microphone having uniform sensitivity and excellent signal-to-noise ratio is implemented.

FIG. 4C shows a structure in which moving comb fingers 300 are formed on the top and bottom of a diaphragm 200 and stationary comb fingers 400 and supports 110 are deviated upward or downward from the moving comb fingers 300.

A support plate 120 is attached to the bottom of the upper support 110 and the top of the lower support 110, and anchors 130 are attached near the edge 120a of the support plate 120. The diaphragm 200 is attached to and supported on the upper and lower anchors 130.

When a "substrate-free area" includes a place where the anchors 130 are located in a plan view, the area of the diaphragm 200 becomes uniform regardless of the area of the "substrate-free area," a low parasitic capacitance is present at the edge 200a of the diaphragm, and a gap acting as acoustic resistance is not present between the diaphragm 200 and the substrate 100 or between the diaphragm 200 and the support plate 120. As a result, a microphone having uniform sensitivity and excellent signal-to-noise ratio is implemented.

When a sacrificial layer 140 remains in the supports 110 shown in FIGS. 3A to 4C, a stress gradient between the sacrificial layer 140 and the supports 110 occurs, and thus the supports 110 may be bent. It is preferable that the sacrificial layers 140 above and below the supports 110 be removed. Accordingly, although not shown in FIGS. 3C and 4C, the sacrificial layer 140 between the upper and lower support plates 120 needs to be removed through holes after forming a number of fine holes having a diameter of 1 μm or less so that sound waves cannot pass through the upper and lower support plates 120.

Although an edge clamped diaphragm in which the diaphragm edge 200a is fixed to the anchor 130 is shown in the MEMS capacitive microphones shown in FIGS. 2 and 4A-4C, it is obvious that an edge released diaphragm in which a diaphragm 200 is supported by a spring 210 may also be applied.

Both a conductor and a non-conductor may be used as the material of the support plate 120. For example, polysilicon, amorphous silicon, aluminum, magnesium, nickel, titanium, vanadium, zirconium, chromium, tungsten, molybdenum, tantalum, silicon nitride, silicon carbide, aluminum oxide, and aluminum nitride may be used. Furthermore, the supports 110 provide the rigidity required for supporting the diaphragm 200, and thus the thickness of the support plate 120 is sufficient if it is 0.1 μm or more. For example, it may be possible to manufacture the support plate 120 to have a thickness in the range of 0.1 to 2 μm.

When the support plate 120 is a conductor, silicon nitride, silicon carbide, aluminum oxide, and aluminum nitride, which are non-conductors, may be used as the material of the anchor 130. When the support plate 120 is a non-conductor, both a conductor and a non-conductor may be used as the material of the anchor 130. Polysilicon, amorphous silicon, aluminum, magnesium, nickel, titanium, vanadium, zirconium, chromium, tungsten, molybdenum, tantalum, silicon nitride, silicon carbide, aluminum oxide, and aluminum nitride may be used.

As described above, the structures and effects of the MEMS capacitive microphones, to which the support plate and anchor provided by the present invention are applied, have been described with reference to FIGS. 2 to 4C.

Meanwhile, the cross-sectional structure of the anchor may be implemented in various forms, and FIGS. 5A to 5F show various cross-sectional structures of anchors provided in the present invention.

Figure 5A:
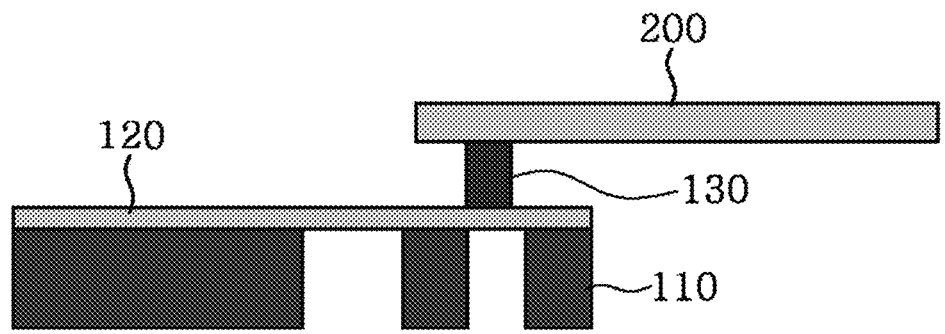
FIGS. 5A to 5F are views showing the cross-sectional structures of various anchors provided by the present invention.

The structure of FIG. 5A is shown in FIGS. 3A to 4C, and is a structure in which an anchor 130 is formed between a diaphragm 200 and a support plate 120. This structure may be formed by etching a sacrificial layer on the support plate 120 to form a trench, depositing, e.g., low-pressure chemical vapor pressure (LPCVD) silicon nitride to fill the trench, and then etching back LPCVD silicon nitride.

Figure 5B:
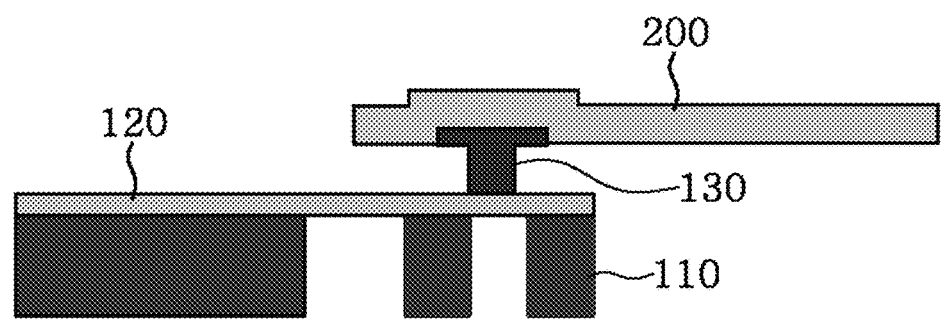

FIG. 5B shows a structure in which an anchor 130 is formed between a diaphragm 200 and a support plate 120, and the bottom of the diaphragm 200 is additionally supported by the anchor 130 in the form of a membrane. This structure may be formed by etching a sacrificial layer on the support plate 120 to form a trench, depositing, e.g., LPCVD silicon nitride to fill the trench and then performing patterning.

Figure 5C:
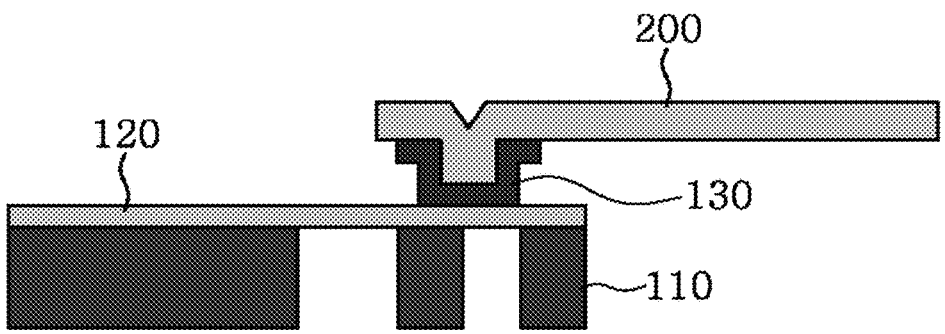

FIG. 5C shows a structure in which an anchor 130 is formed between a diaphragm 200 and a support plate 120, in which case the bottom of the diaphragm 200 is supported by the a '⌴'-shaped anchor. This structure may be formed by the same process as the structure of FIG. 5B, and they are different only in that a trench is simply widened and the trench is not completely filled with silicon nitride.

Figure 5D:
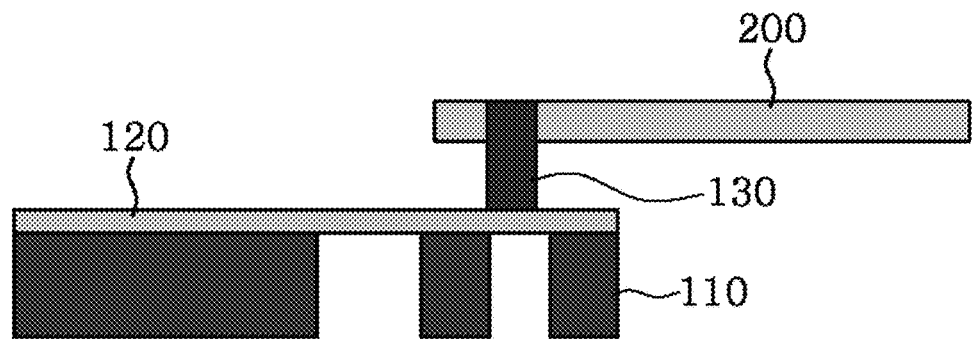

FIG. 5D shows a structure in which an anchor 130 is formed through a diaphragm 200. This structure may be formed by etching a diaphragm layer and a sacrificial layer on a support plate 120 to form a trench, depositing, e.g., LPCVD silicon nitride to fill the trench and then performing etching back.

Figure 5E:
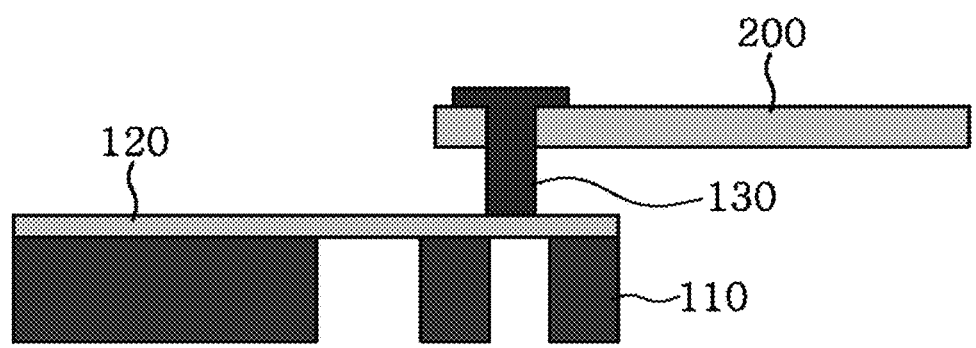

FIG. 5E shows a structure in which an anchor 130 is formed through a diaphragm 200, in which case the diaphragm 200 is additionally covered with the membrane-shaped anchor 130. This structure may be formed by etching a diaphragm layer and a sacrificial layer on a support plate 120 to form a trench, depositing, e.g., LPCVD silicon nitride to fill the trench, and then performing patterning.

Figure 5F:
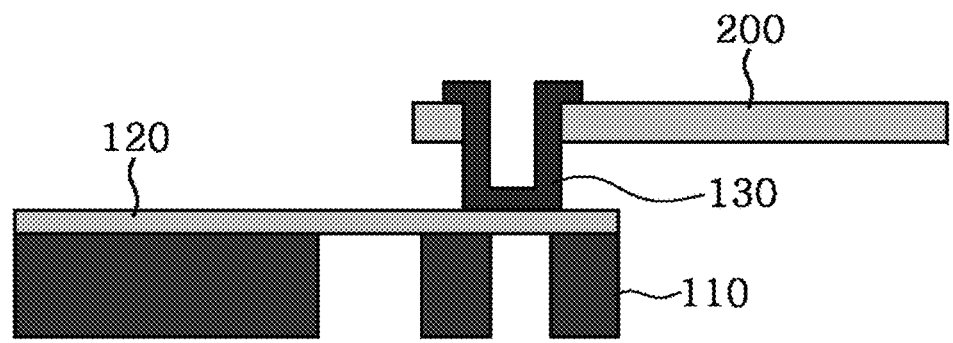

FIG. 5F shows a structure in which an anchor 130 is formed by passing through a diaphragm 200 in a '⌴' shape. This structure may be formed by the same process as the structure of FIG. 5E, and they are different only in that a trench is simply widened and the trench is not completely filled with silicon nitride.

The structures of the anchors 130 shown in FIGS. 5A to 5F are illustrated as representatives of the cases where the support 110 is located below the diaphragm 200, i.e., the cases of FIGS. 3B and 4B.

However, this may be applied to the cases where the support 110 is located below the diaphragm 200 or the supports are located above and below the diaphragm 200 in pairs, i.e., the cases of FIGS. 3A, 3C, 4A and 4C, in the same manner. In this case, the support plate 120 is located above the diaphragm 200, and thus it is necessary to interchange the terms of the diaphragm 200 and the support plate 120 with each other in terms of the order of the manufacturing process (In FIGS. 5A to 5F, it is necessary to interchange the terms diaphragm and support plate with each other).

Figure 6A:
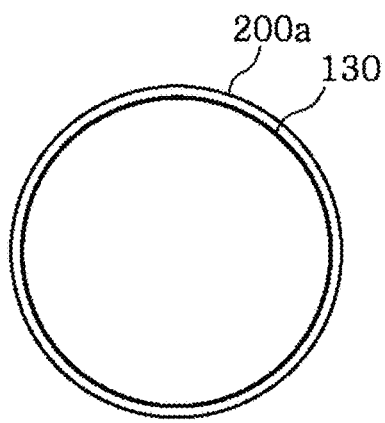
FIGS. 6A to 6F are views showing the planar structures of various anchors provided by the present invention.
Figure 6B:
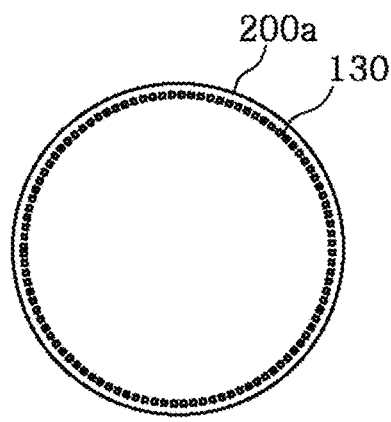
Figure 6C:
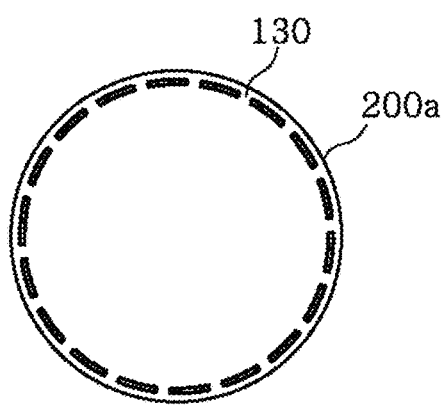

FIGS. 6A to 6F show methods by which various anchors are arranged in a plane. As shown in FIG. 6A, the diaphragm 200 may be surrounded at the diaphragm edge 200a by the single-type anchor 130 shown in FIGS. 5A to 5F. As shown in FIG. 6B, a plurality of point-shaped single anchors 130 having a predetermined diameter or width may be arranged along a diaphragm edge 200a. As shown in FIG. 6C, a plurality of single anchors 130 having a predetermined length may be arranged along a diaphragm edge 200a.

Figure 6D:
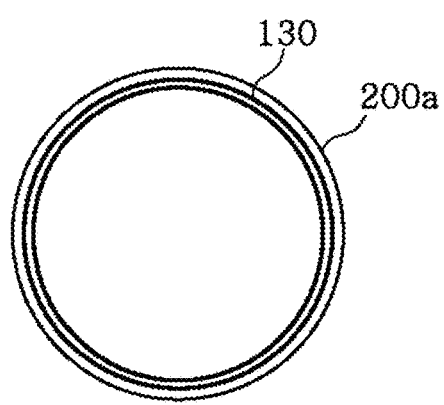
Figure 6E:
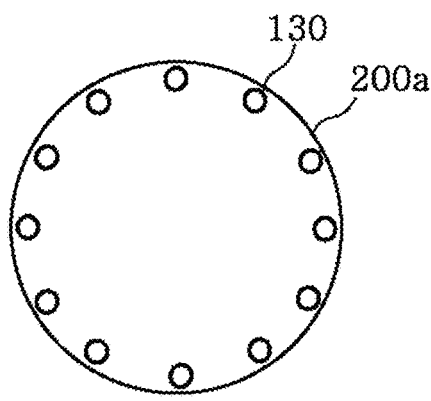
Figure 6F:
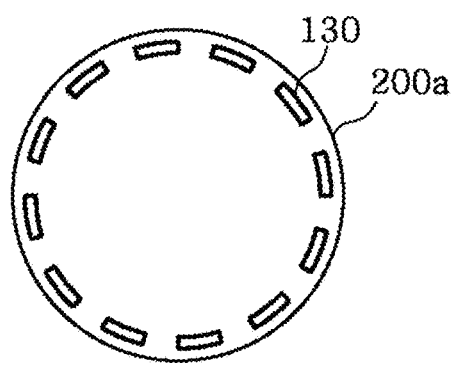

Alternatively, as shown in FIG. 6D, a diaphragm 200 is surrounded by single anchors 130 in two lines at a diaphragm edge 200a. As shown in FIG. 6E, a plurality of circular or rectangular single anchors 130 that are connected by a closed curve are arranged along a diaphragm edge 200a. As shown in FIG. 6F, a plurality of rod-shaped single anchors 130 that are connected by a closed curve may be arranged along a diaphragm edge 200a.

In addition, a diaphragm edge 200a may be surrounded by single anchors 130 in three or more lines, or circular, rectangular, or rod-shaped single anchors 130 in two or more lines connected by a closed curve may be arranged along a diaphragm edge 200a. In this case, a diaphragm (or support plate) is disposed above (or below) a single anchor 130 between single anchors 130, and thus a sacrificial layer remains between the single anchors (see FIG. 7J).

The structures of FIGS. 2 to 4C proposed in the present invention may be implemented by various manufacturing methods. For example, FIGS. 7A to 7J show an example of the process of manufacturing the microphone of the present invention, in which moving comb fingers are formed below a diaphragm and stationary comb fingers are disposed on both sides of the moving comb fingers and deviated downward from the moving comb fingers in a plan view.

Figure 7A:
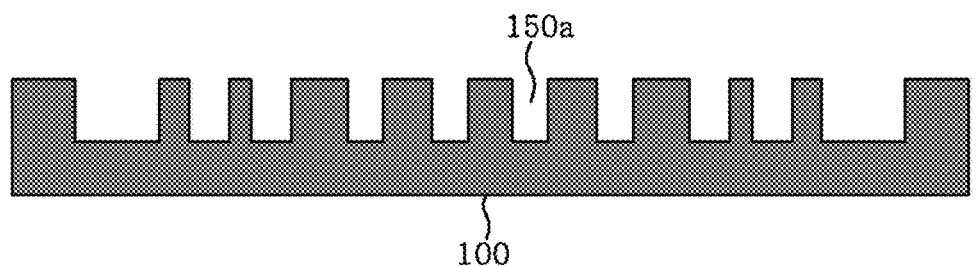
FIGS. 7A to 7J are views showing an example of the process of manufacturing a MEMS capacitive microphone to which the support plate and anchor of the present invention are applied.
Figure 7B:
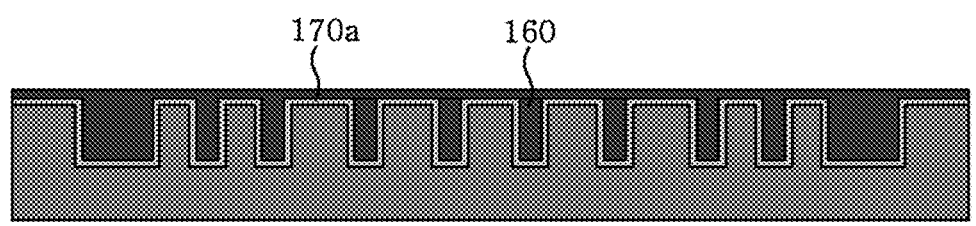

First, a first trench 150a is formed in a silicon substrate by a reactive ion etching (RIE) method, as shown in FIG. 7A. When the silicon oxide film is deposited by an LPCVD method and then polysilicon 160 is deposited by an LPCVD method, a silicon oxide film acting as a first protective layer 170a is deposited on the inner surface of the first trench 150a and polysilicon 160 is filled in the first trench 150a, as shown in FIG. 7B.

Figure 7C:
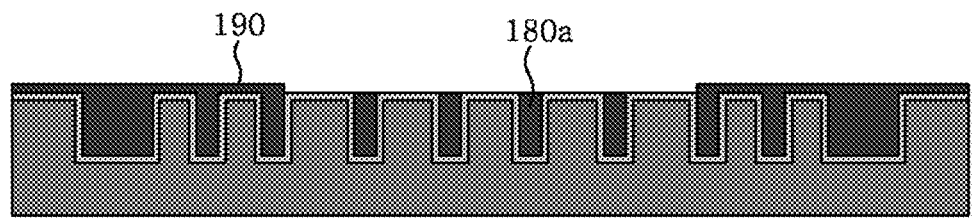

Thereafter, when the deposited polysilicon is etched back locally, the first trench 150a remains filled with the first conductor 180a in an etched area and polysilicon 160 as the first conductive layer 190 remains in an non-etched area, as shown in FIG. 7C. The first conductor 180a filled in the first trench 150a, from which the first conductive layer 190 has been removed, finally forms stationary comb fingers 400.

Furthermore, the first conductive layer 190 finally forms a support plate, and the first conductor 180a filled in the first trench 150a in which the first conductive layer 190 remains finally forms a support 110.

The first protective layer 170a serves to protect the first conductor 180a and the first conductive layer 190 from silicon etching when the bottom surface of the substrate 100 is etched to form a "substrate-free area" that proceeds later, and also serves to release the first conductor 180a and the first conductive layer 190 in such a manner as to act as a sacrificial layer and be finally removed.

In the present embodiment, the width of the first conductor 180a is 2 µm and the thickness thereof is 6 µm. In this case, the thickness of the first conductive layer 190 is 1.2 µm. In addition, the thickness of the first protective layer 170a is 0.5 µm.

Figure 7D:
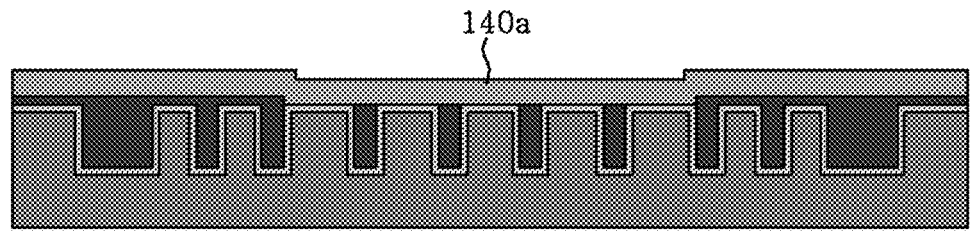
Figure 7E:
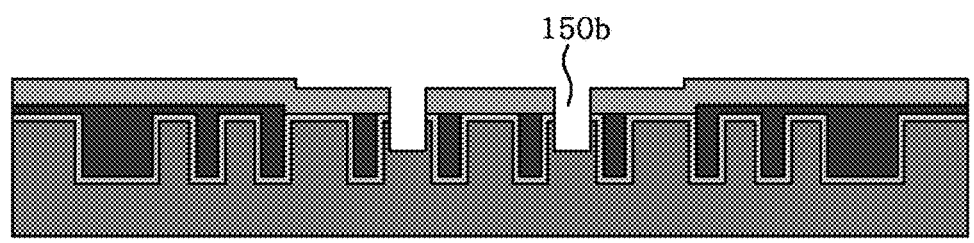
Figure 7F:
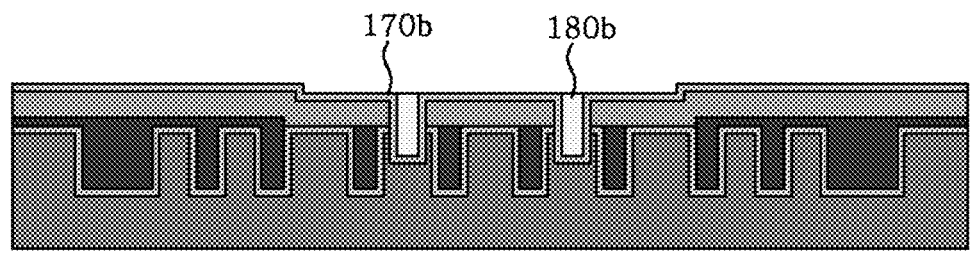

Thereafter, a silicon oxide film is deposited as the first sacrificial layer 140a, as shown in FIG. 7D, and then the first sacrificial layer 140a, the first protective layer 170a and a silicon substrate are sequentially etched to form a second trench 150b in alignment with the first conductor 180a, as shown in of FIG. 7E. Then, when the silicon oxide film is deposited by the LPCVD method, the polysilicon 160 is deposited by the LPCVD method, and then the polysilicon 160 is etched, a silicon oxide film as the second protective layer 170b is deposited on the inner surface of the second trench 150b and polysilicon 160 as the second conductor 180b is filled in the second trench 150b, as shown in FIG. 7F. The second conductor 180b finally forms the moving comb fingers 300 and the stiffeners.

The second protective layer 170b serves to protect the second conductor 180b from silicon etching when the bottom surface of the substrate 100 is etched later and also serves to release the second conductor 180b in such a manner as to act as a sacrificial layer and be finally removed.

In the present embodiment, the width of the second conductor 180b is 2 μm and the thickness thereof is 6 μm. The thickness of the first sacrificial layer 140a is 1.5 μm, and the thickness of the second protective layer 170b is 0.5 μm.

Figure 7G:
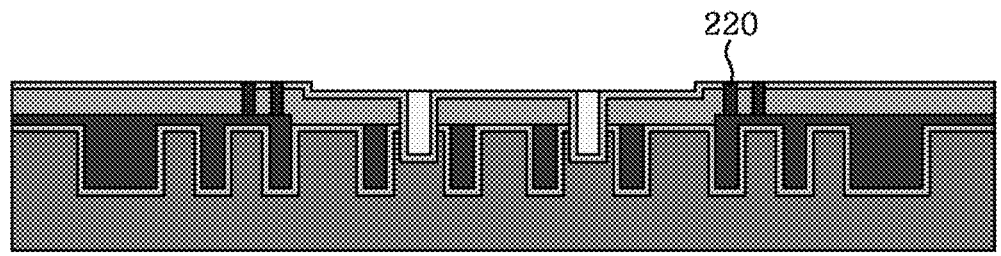

Thereafter, a trench is formed by sequentially etching the second protective layer 170b and the first sacrificial layer 140a on the edge of the first conductive layer 190 finally forming the support plate 120, and then silicon nitride 220 formed as the anchor 130 is finally filled in the trench, as shown in FIG. 7G, by depositing silicon nitride using the LPCVD method and then etching silicon nitride. In the present invention, the width of silicon nitride 220 filled in the trench is set to 0.5 μm, and is formed in two lines.

Figure 7H:
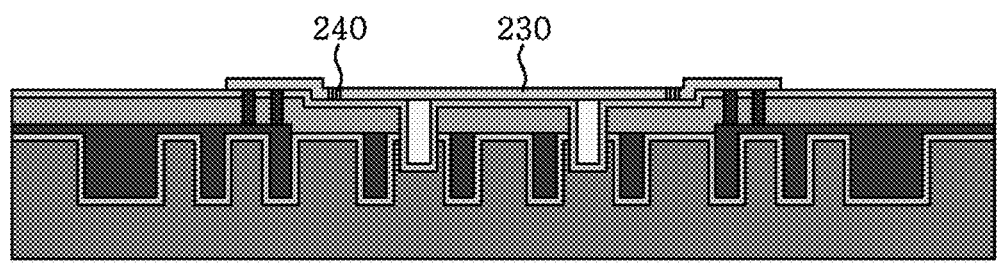

Thereafter, polysilicon 160 having a thickness of 1 μm is deposited and patterned to form an elastic layer 230 that will finally form a diaphragm 200, as shown in FIG. 7H. In the present invention, a plurality of gaps 240 having a width of 0.5 μm are formed in the edge region of the elastic layer 230 so that the spring 210 is finally formed at the edge of the diaphragm and the gaps 240 finally become vent holes. In other words, in this embodiment, the diaphragm 200 is intended to be formed as an edge released diaphragm.

Figure 7I:
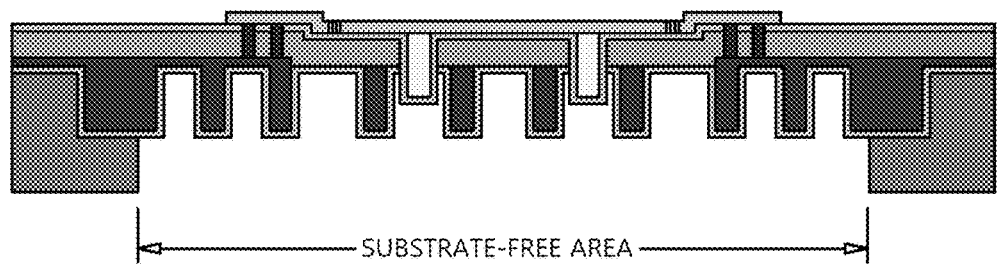

Thereafter, as shown in FIG. 7I, when the bottom surface of silicon is etched by the RIE method to form a "substrate-free area," the first conductor 180a, the first conductor layer 190, and the second conductor 180b are protected by the first protective layer 170a and the second protective layer 170b and remain.

Figure 7J:
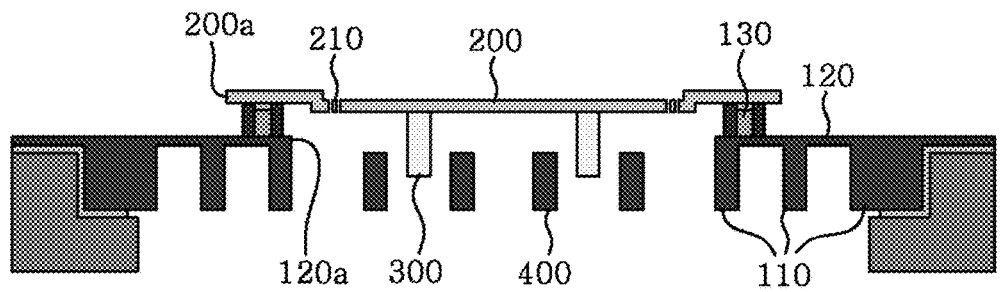

Finally, as shown in FIG. 7J, when the first protective layer 170a, the first sacrificial layer 140a, and the second protective layer 170b are etched using hydrofluoric acid vapor, the MEMS microphone of the present invention is finally manufactured.

In other words, there is implemented a MEMS capacitive microphone in which the moving comb fingers 300 are attached to the bottom of the diaphragm 200, the stationary comb fingers 400 are arranged at regular intervals on both sides of the moving comb fingers 300 and deviated downward from the moving comb fingers 300 in a plan view, and the diaphragm 200 is suspended from the diaphragm edge 200a supported by the anchor 130 formed in the region of the support plate edge 120a formed on the support 110 through the spring 210.

In an embodiment of the present invention, an anchor is formed in the planar shape shown in FIG. 6A by using the single anchor 130, shown in FIG. 5A, in two lines. As a result, the anchor 130 is formed in a form in which both sides of a protective layer are surrounded with silicon nitride.

Meanwhile, since an interconnection process is conventional, it is omitted in the shown manufacturing process.

In the manufacturing process of FIGS. 7A to 7J, polysilicon forming the first conductor 180a, the first conductive layer 190, the second conductor 180b, and the elastic layer 230 needs to be doped with an impurity in order to have conductivity. In the present invention, conductivity is imparted to the first conductor 180a, the first conductive layer 190, the second conductor 180b, and the elastic layer 230 by using in situ phosphorous doped polysilicon.

Although the process of manufacturing the MEMS capacitive microphone in which the moving comb fingers 300 shown in FIG. 3B are formed on the bottom of the diaphragm 200 and the stationary comb fingers 400 are disposed on both sides of the moving comb fingers 300 in a plan view is shown in FIGS. 7A to 7J, the structure of FIG. 4B may be manufactured using the same process.

Furthermore, the structures of the lower moving comb fingers 300b, the lower stationary comb fingers 400b, the lower support 110b, the lower support plate 120, the lower anchor 130 and the diaphragm 200 shown in FIGS. 3C and 4C may be formed by applying the process of FIGS. 7A to 7J.

In the MEMS capacitive microphone manufactured using the manufacturing process of FIGS. 7A to 7J, the support 110 and the stationary comb fingers 400 with the thickness of the first protective layer 170a subtracted are located below the silicon surface of the silicon substrate, and the moving comb fingers 300 with the thickness of the first sacrificial layer 140a and the second protective layer 170b subtracted is located below the silicon surface of the silicon substrate. Although the ratio of the thickness below the silicon surface of the silicon substrate to the overall thickness of the moving comb fingers 300, the support 110, and the stationary comb fingers 400 may vary depending on the thickness of each film and the thickness of the first conductor 180a and the second conductor 180b, it is set to 50% or more in the present invention.

Meanwhile, in the edge released diaphragm shown in FIGS. 7A to 7J, when the gap 240 is wide or long, sound waves may leak excessively and thus sensitivity may decrease at low frequencies. In this case, when the support plate 120 is extended from the diaphragm edge 200a to a location after the gap, i.e., when it is extended within 20 μm from the gap 240 toward the inside of the diaphragm 200, leakage resistance increases and thus sensitivity may be improved at low frequencies.

As described above, the preferred embodiments according to the present invention have been discussed. The fact that the present invention may be embodied in other specific forms without departing from the spirit or scope of the present invention in addition to the above-described embodiments is apparent to those having ordinary skill in the art.

Therefore, the above-described embodiments should be regarded as illustrative rather than restrictive, and accordingly, the present invention is not limited to the above description, but may be modified within the scope of the appended claims and equivalents thereof.

The MEMS capacitive microphone according to the present invention can significantly contribute to the provision of a microphone having uniform sensitivity and excellent signal-to-noise ratio.

What is claimed is:
1. A MEMS capacitive microphone, wherein:
a support plate (120) from which an inside thereof has been removed in a plane is attached to supports (110) each having an end fixed to a substrate (100), an anchor (130) is attached to an edge region of the support plate (120), an edge of a diaphragm (200) is supported by the anchor (130), and a "substrate-free area" includes the anchor (130) in a plan view;
pluralities of moving comb fingers (300) and stiffeners are attached to a top or bottom or a top and bottom of the diaphragm (200), and the supports (110) support the stationary comb fingers (400) arranged at predetermined intervals on both sides of the moving comb fingers (300) in a plan view;
when the moving comb fingers (300) and the stiffeners are attached to the top of the diaphragm (200), the supports (110) and the stationary comb fingers (400) are located above the diaphragm (200), the support plate (120) is attached to a bottom of the support (110), and the stationary comb fingers (400) are deviated upward from the moving comb fingers (300);
when the moving comb fingers (300) and the stiffeners are attached to the bottom of the diaphragm (200), the supports (110) and the stationary comb fingers (400) are located below the diaphragm (200), the support plate (120) is attached to a top of the support (110), and the stationary comb fingers (400) are deviated downward from the moving comb fingers (300); and
when the moving comb fingers (300) and the stiffeners are attached to the top and bottom of the diaphragm (200), the supports (110) and the stationary comb fingers (400) are located above and below the diaphragm (200), the support plate (120) is attached to a bottom of a lower support (110a) and a top of a lower support (110b), and upper stationary comb fingers (400a) are deviated upward from upper moving comb fingers (300a) and lower stationary comb fingers (400b) are deviated downward from lower moving comb fingers (300b).

2. A MEMS capacitive microphone, wherein:
a support plate (120) from which an inside thereof has been removed in a plane is attached to supports (110) each having an end fixed to a substrate (100), an anchor (130) is attached to an edge region of the support plate (120), an edge of a diaphragm (200) is supported by the anchor (130), and a "substrate-free area" includes the anchor (130) in a plan view;
a plurality of stiffeners and a plurality of moving comb fingers (300) which are formed in an area from which the diaphragm (200) has been removed and ends of which have been fixed to the diaphragm (200) are attached to a top or bottom or a top and bottom of the diaphragm (200), and the supports (110) support the stationary comb fingers (400) arranged at predetermined intervals between the moving comb fingers (300) in a plan view;
when the moving comb fingers (300) and the stiffeners are attached to the top of the diaphragm (200), the supports (110) and the stationary comb fingers (400) are located above the diaphragm (200), the support plate (120) is attached to a bottom of the support (110), and the stationary comb fingers (400) are deviated upward from the moving comb fingers (300);
when the moving comb fingers (300) and the stiffeners are attached to the bottom of the diaphragm (200), the supports (110) and the stationary comb fingers (400) are located below the diaphragm (200), the support plate (120) is attached to a top of the support (110), and the stationary comb fingers (400) are deviated downward from the moving comb fingers (300); and
when the moving comb fingers (300) and the stiffeners are attached to the top and bottom of the diaphragm (200), the supports (110) and the stationary comb fingers (400) are located above and below the diaphragm (200), the support plate (120) is attached to a bottom of a lower support (110a) and a top of a lower support (110b), and upper stationary comb fingers (400a) are deviated upward from upper moving comb fingers (300a) and lower stationary comb fingers (400b) are deviated downward from lower moving comb fingers (300b).

3. The MEMS capacitive microphone of claim 1, wherein the diaphragm (200) is one selected from an edge clamped diaphragm and an edge released diaphragm.

4. The MEMS capacitive microphone of claim 3, wherein when the diaphragm (200) is the edge released diaphragm, the support plate (120) is extended within 20 μm from a gap between the spring (210) and the diaphragm (200) into the diaphragm (200) in a plan view.

5. The MEMS capacitive microphone of claim 1, wherein the diaphragm (200) has a circular, square, rectangular, hexagonal or octagonal shape, or a polygonal shape having arbitrary surfaces, and has an area of 0.01 mm² to 4 mm².

6. The MEMS capacitive microphone of claim 1, wherein the support (110), the stiffeners, the moving comb fingers (300), and the stationary comb fingers (400) have a thickness of 2 μm to 20 μm, and the support (110), the stiffeners, the moving comb fingers (300), and the stationary comb fingers (400) have a width of 1 μm to 10 μm.

7. The MEMS capacitive microphone of claim 1, wherein an interval between the moving comb fingers (300) and the stationary comb fingers (400) is 0.5 μm to 5 μm, and a distance to which the stationary comb fingers (400) are deviated vertically from the moving comb fingers (300) is 1 μm to 10 μm.

8. The MEMS capacitive microphone of claim 1, wherein a thickness of the support plate (120) is 0.1 μm to 2 μm.

9. The MEMS capacitive microphone of claim 1, wherein an interval between the stationary comb fingers (400) and the stationary comb fingers (400) is 5 μm to 20 μm.

10. The MEMS capacitive microphone of claim 1, wherein a cross-sectional structure of the anchor (130) is one selected from:
a structure in which the anchor (130) is formed between the diaphragm (200) and the support plate (120);
a structure in which the anchor (130) is formed between the diaphragm (200) and the support plate (120) and the anchor (130) in a membrane form additionally supports a bottom of the diaphragm (200) or the support plate (120);
a structure in which the anchor (130) is formed between the diaphragm (200) and the support plate (120) and the anchor (130) supports the diaphragm 200 or the support plate 120 in a '⌒' form;
a structure in which the anchor (130) is formed through the diaphragm (200) or the support plate (120);
a structure in which the anchor (130) is formed through the diaphragm (200) or the support plate (120) and the diaphragm (200) or the support plate (120) is additionally covered by the anchor (130) in a membrane form; and
a structure in which the anchor (130) is formed through the diaphragm (200) or the support plate (120) in a '⌒' form.

11. The MEMS capacitive microphone of claim 10, wherein a planar structure of the anchor (130) is one selected from:
a closed curve structure in which the anchor (130) surrounds the diaphragm (200) at the diaphragm edge (200a) in one line;

a closed curve structure in which the anchor (130) includes anchors that surround the diaphragm (200) at the diaphragm edge (200a) in two or more lines;

a structure in which the anchor (130) includes anchors that are arranged along the diaphragm edge (200a) in a point or line form having a predetermined width and diameter; and a structure in which the anchor (130) includes anchors one or more lines of which are connected by a closed curve to form a circle, square or rod form and arranged along the diaphragm edge (200a).

12. The MEMS capacitive microphone of claim 11, wherein the anchor (130) has a width in a range of 0.2 μm to 20 μm and a thickness in a range of 1 μm to 10 μm.

13. The MEMS capacitive microphone of claim 1, wherein the diaphragm (200), the stiffeners, the moving comb fingers (300) and the stationary comb fingers (400) are made of one selected from polysilicon, amorphous silicon, aluminum, titanium, magnesium, nickel, tungsten, and copper.

14. The MEMS capacitive microphone of claim 1, wherein the supports (110), the support plate (120) and the anchor (130) are made of one or more selected from polysilicon, amorphous silicon, aluminum, titanium, magnesium, nickel, tungsten, copper, silicon nitride, silicon carbide, aluminum oxide, and aluminum nitride.

15. The MEMS capacitive microphone of claim 1, wherein:

the stiffeners or supports (110) are coupled in groups including one or more members; and the coupled stiffeners or supports (110) are connected in parallel with each other;

the coupled stiffeners or supports (110) are connected in a polygonal form; or the stiffeners or supports (110) connected in parallel with each other and the stiffeners or supports (110) connected in a polygonal form are connected in a coupled form.

16. The MEMS capacitive microphone of claim 1, wherein:

in a MEMS capacitive microphone in which the moving comb fingers (300) and the stiffeners are attached to a bottom of the diaphragm (200), the supports (110) and the stationary comb fingers (400) are located below the diaphragm (200), and the stationary comb fingers (400) are deviated downward from the moving comb fingers (300), and a MEMS capacitive microphone in which the moving comb fingers (300) and the stiffeners are attached to a top and bottom of the diaphragm (200), the supports (110) and the stationary comb fingers (400) are located above and below the diaphragm (200), and the stationary comb fingers (400) are deviated upward and downward from the moving comb fingers (300);

50% or more of a thickness of the lower moving comb fingers (300b), the lower stationary comb fingers (400b), and the lower supports (110b) is located below a silicon surface of the silicon substrate.

17. The MEMS capacitive microphone of claim 1, wherein the supports (110) each have a structure extending upward or downward based on the deviated direction so that it has a '⊓'- or '⊔'-shaped cross-section.

* * * * *